United States Patent [19]

Conrad et al.

[11] 4,134,631

[45] Jan. 16, 1979

[54] MODULAR PLUG BOARD SYSTEM

[75] Inventors: Jack S. Conrad; Richard F. Granitz; Joseph L. Lockard, all of Harrisburg, Pa.

[73] Assignee: AMP Incorporated, Harrisburg, Pa.

[21] Appl. No.: 832,845

[22] Filed: Sep. 13, 1977

[51] Int. Cl.² ............... H01R 25/00; H05K 1/14
[52] U.S. Cl. ............... 339/17 M; 339/18 B; 339/75 M; 361/415
[58] Field of Search ............ 339/17 L, 17 LM, 17 M, 339/18 R, 18 B, 18 C, 18 P, 45 M, 75 MP; 361/413, 415

[56] References Cited

U.S. PATENT DOCUMENTS

| | | | |
|---|---|---|---|
| 3,184,700 | 5/1965 | Burke et al. | 339/18 B |
| 3,335,386 | 8/1967 | Upton | 339/45 M |
| 3,341,801 | 9/1967 | Brookman et al. | 339/18 |
| 3,348,187 | 10/1967 | Friend | 339/18 B |
| 3,781,763 | 12/1973 | Feeser et al. | 339/91 P |

OTHER PUBLICATIONS

IBM Tech. Disc. Bulletin, Gafford, vol. 13, No. 3, p. 693, 8-1970.

Primary Examiner—Neil Abrams
Attorney, Agent, or Firm—Gerald K. Kita

[57] ABSTRACT

A modular plug board system is disclosed for interconnecting an array of parallel cards in a card cage. The cards are pluggably connected to the IO circuit board of a machine to be programmed by the plug board system. A rear board of the plug board system is divided into sections which impinge one another in side to side relationship. The sections are pluggably connected to corresponding cards and are individually removable from the plug board system to allow for individual removal of the cards from the card cage and from pluggable connection with the IO circuit board. One or more cards may be eliminated from the card cage to allow for discrete wire or cable connection directly from the IO circuit board to an appropriate section of the plug board system.

5 Claims, 12 Drawing Figures

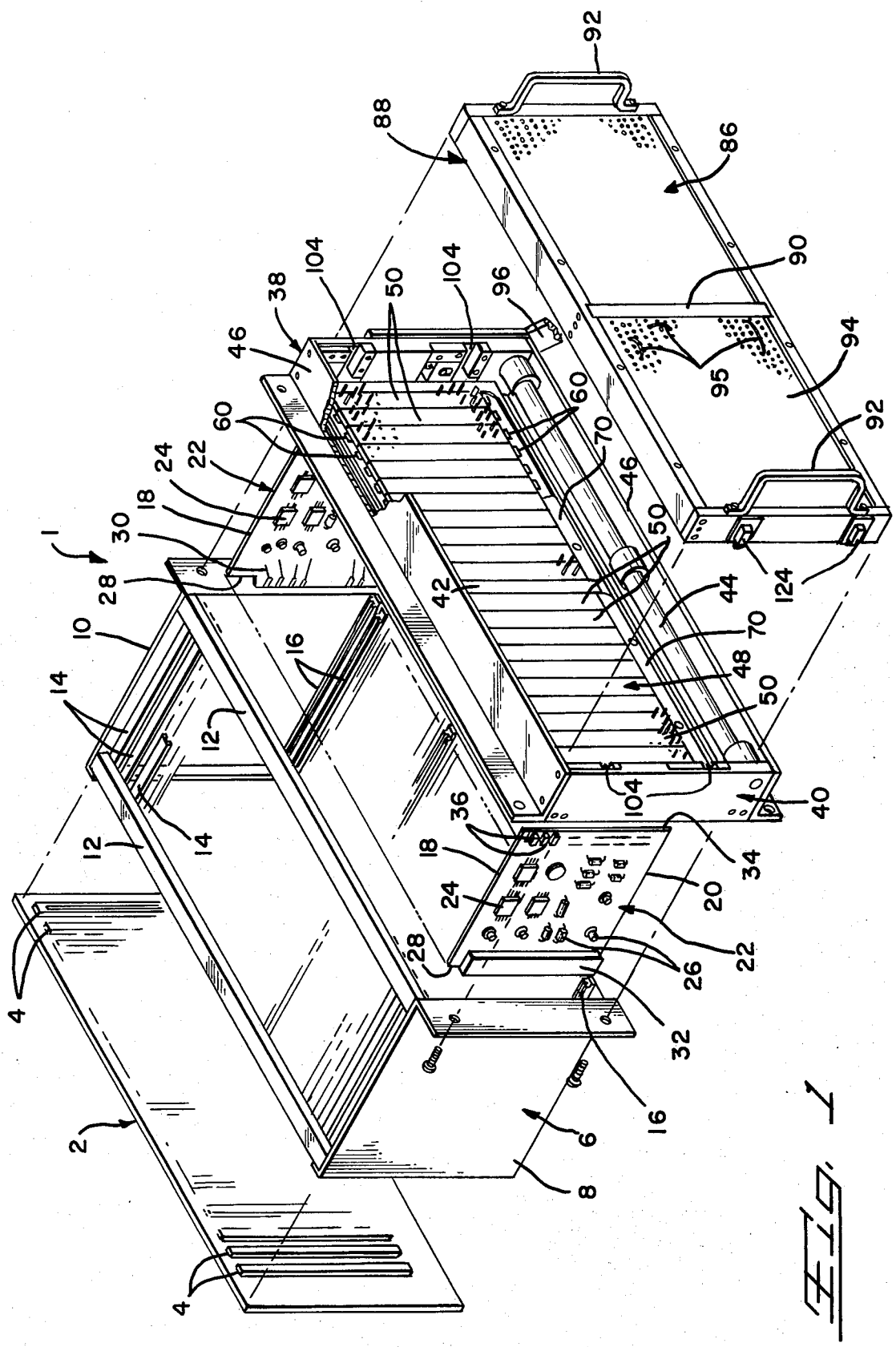

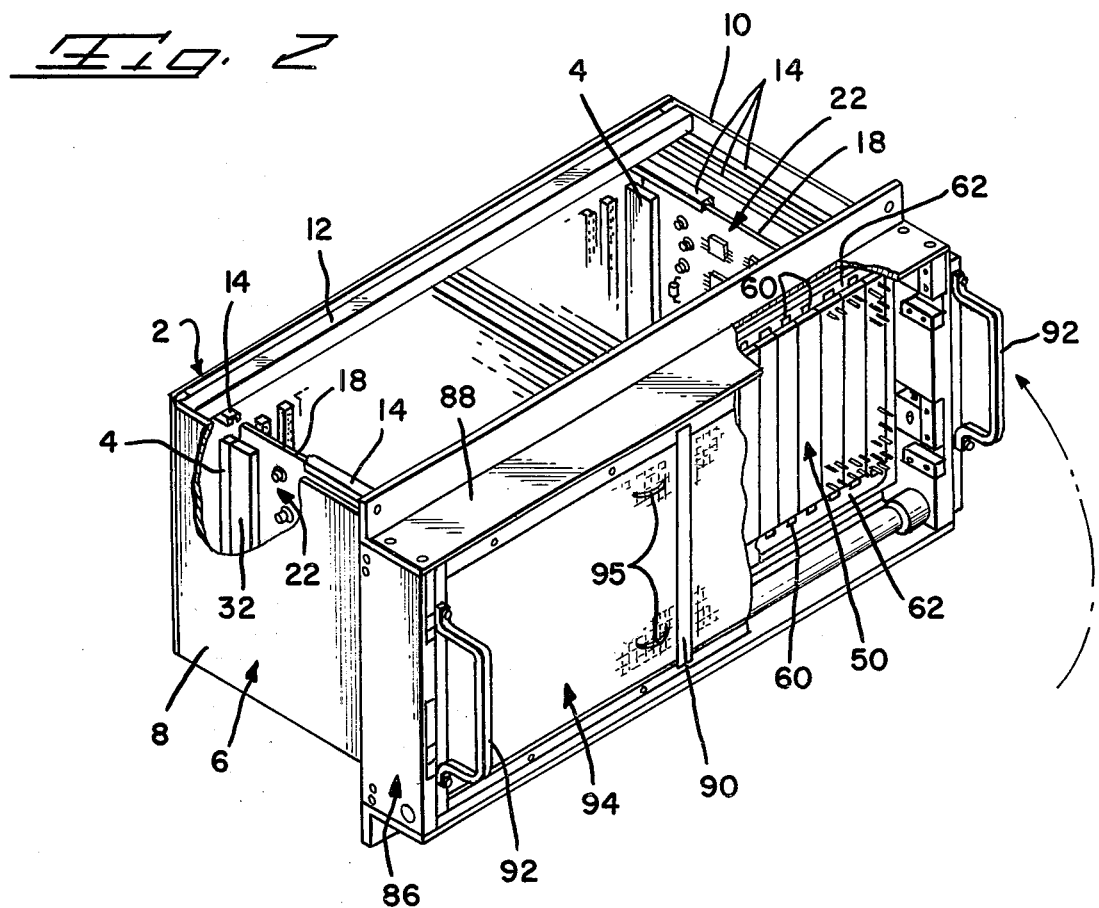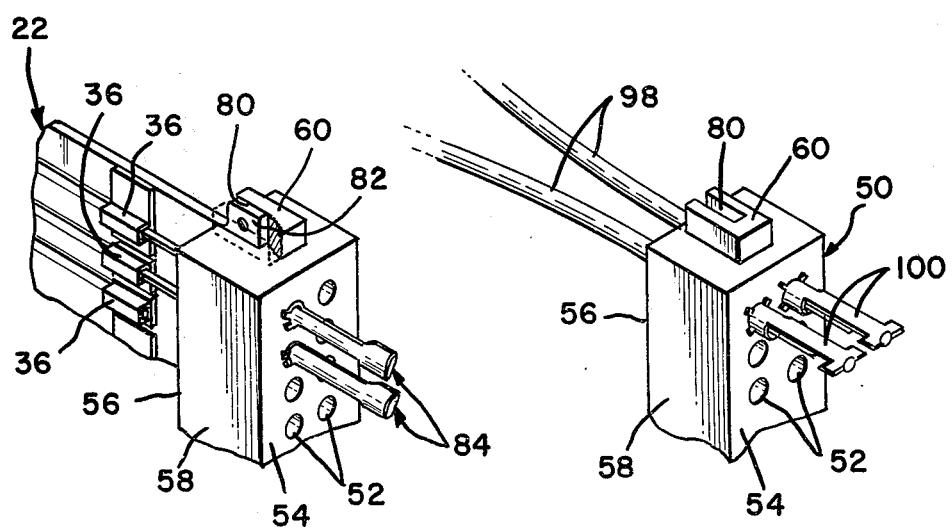

MODULAR PLUG BOARD SYSTEM

BACKGROUND OF THE PRIOR ART

A typical plug board system of the prior art is shown in U.S. Pat. Nos. 3,348,187, or 3,341,801, and is of the type for programming the electrical in and out, IO, connections of a machine such as a computer or data collection terminal. Such a plug board system comprises a rear bay having an apertured rear board into which are plugged electrical connections from a machine to be programmed. The plug board system further includes a separate front bay having another apertured board on which interconnections are made by a patterned array of patchcords, typically described in U.S. Pat. No. 3,781,763. As the front bay is assembled on the rear bay the patchcord interconnections become plugged into the apertured rear board whereupon they contact and thereby interconnect the IO connections. By changing the pattern of patchcord interconnections on the front board, the interconnections to the apertured rear board can be changed. The program changes therefore appear only on the front board leaving unchanged the interface of the rear board and the machine to be programmed.

Sometimes it is desired to add circuit changes or circuit modifications which are more complex than mere patchcord connections. For example, it may be desirable to modify incompatible or mismatched circuits before interconnection thereof with patchcords. Other circuit modification include, signal conversion, voltage or power control, signal or wave modification, etc. Other circuit conditions requiring modification may exist but are too numerous and varied to be set out in detail. It is sufficient to mention that patchcord programming systems of the prior art have been inadequate to accommodate circuit modifications requiring something more than patchcord interconnections.

The circuit modifications being considered are those that require active circuit devices on circuit boards which sometimes are incorporated internally of the machine being programmed. This, however, requires entry of the machine being programmed. Often it is not practicable to enter the machine and modify it internally. The only other choice is to mount the modifying circuit boards externally of the machine and provide wire or cable interconnections running to the machine and also to the plug board. Such interconnections are lengthy and unwieldy. Oftentimes the plug board directly covers the IO panel of the machine to be programmed. The addition of modifying circuit boards then requires relocation of the plug board and reconnection of the same to the IO panel and to the modifying circuit boards by electrical conductors or cables.

What has been described are the problems associated with incorporating circuit modifications into a machine being programmed by a plug board system. Due to the complexity and the number of circuit modifications which are desired in order to make the programmed machine more versatile, a number of circuit modifying devices are required. Multiple circuits are usually fabricated into plug in control modules. More specifically, these modules are in the form of active circuit devices interconnected by plated metal circuit paths on flat circuit boards which are commonly called cards. The cards are typically of common size and shape and are contained within an enclosure commonly called a card cage. The cards are arranged in parallel spaced relationship with the edges of the cards projecting from the card cage. Electrical connections are made to these card edges and thereby to the circuit paths and active circuit devices. A problem exists whenever the card cage is to be electrically connected to the machine to be programmed and also to a plug board which normally programs the machine. For example, the machine to be programmed is itself fabricated of one or more card cages. There is usually no room in the machine for additional card cages. This and other considerations exist which require the added card cage to be mounted externally of the machine. The impractical result is an unwieldy array of electrical wires running between the machine to be programmed, between the card cage and the plug board, and between the machine and the plug board.

THE PRESENT INVENTION

The present invention was devised to alleviate the problem existing in the prior art, namely, how to interconnect circuit modifying devices, especially a card cage, with a machine being programmed by a plug board. The invention first requires that the IO connections of the machine be located all in one IO panel or circuit board. A card cage for the plug-in modules that comprise the circuit modifying devices is then sized to encircle the IO panel externally of the machine. The card edges of the plug-in modules are then electrically connected to the IO circuit board using any selected pluggable connection devices of the types to be described in detail hereinafter. The plug board rear bay is sized for mounting directly onto the card cage, with the rear board electrically connected to the cards. More particularly, the card edges project perpendicular to the surface of the rear board. Electrical connection devices of various forms are selected to pluggably connect the edges of the cards, and thereby the circuitry thereon, with plating lined apertures of the rear board. The rear board is divided into a plurality of sections which are stacked together and which are interdigitated with the card edges. The sections are individually removable from the rear bay to expose corresponding cards. The cards themselves then can be removed individually from the card cage and from pluggable connection with the IO circuit boards. This allows for individual fabrication, testing, and repair of each card without disturbing the plug board system, the other cards, or the IO circuit board. In addition, cable connections directly from the IO circuit board to the plug board system protectively extend through the card cage and are not disturbed by individual assembly or removal of cards. During assembly of a plug board system according to the present invention, fabrication and testing of each individual card can be accomplished prior to programming the front and rear bays, thereby isolating problems before wasting programming time.

Each section of the divided rear board has at least one row of apertures which remain open to provide ports for air circulation or air exhaust when air is forcibly circulated through the card cage for cooling purposes. Another feature of the invention allows for elimination of a card anywhere in the array to allow discrete wires, for power or signal, or to allow coaxial cables to extend directly from the IO circuit board to appropriate sections of the rear bay. All of such discrete wires or cables are contained within and protected by the card cage.

OBJECTS

An object of the present invention is to provide a plug board programming system for a machine wherein a rear board of a plug board is divided into sections which are individually removable to expose corresponding circuit cards which in turn can be removed individually from a card cage and from pluggable connection with an IO circuit board of the machine to be programmed.

Another object of the present invention is to provide a plug board programming system for a machine which incorporates a card cage containing a plurality of plug-in modules in the form of circuit cards pluggably connected to an IO circuit board of the machine and to individually removable sections of a rear board of the plug board system, the rear board sections being removably pluggably connected to individual cards or, alternatively, connected by electrical leads in the form of discrete wires or coaxial cables or multi-conductor cables extending through the card cage and directly to the IO circuit board of the machine to be programmed.

Other objects and advantages of the present invention which would be obvious to one of ordinary skill will become apparent upon perusal of the following detailed description taken in conjunction with the drawings.

DRAWINGS

FIG. 1 is a fragmentary perspective of a preferred embodiment of a plug board system according to the present invention illustrating, from left to right, a circuit board containing the IO connections of the machine to be programmed, a card cage, a plurality of plug-in modules in the form of circuit cards slidably mounted in a card cage and edge mounted to the surface of an IO circuit board, a plug board rear bay mounted on the card cage and containing an apertured rear board divided into a plurality of sections each pluggably connected to an edge of a corresponding circuit card, and a plug board front bay removably attachable to the rear bay and containing an apertured front board into which patchcords are pluggably arranged in a desired program or pattern.

FIG. 2 is a perspective of the preferred embodiment as shown in FIG. 1 with the parts assembled and with parts broken away to illustrate the details thereof.

FIG. 3 is an enlarged fragmentary perspective illustrating a section of the rear board pluggably connected to a corresponding circuit card.

FIG. 4 is an enlarged fragmentary perspective of a rear board section into which are plugged discrete electrical leads.

Figure 10:
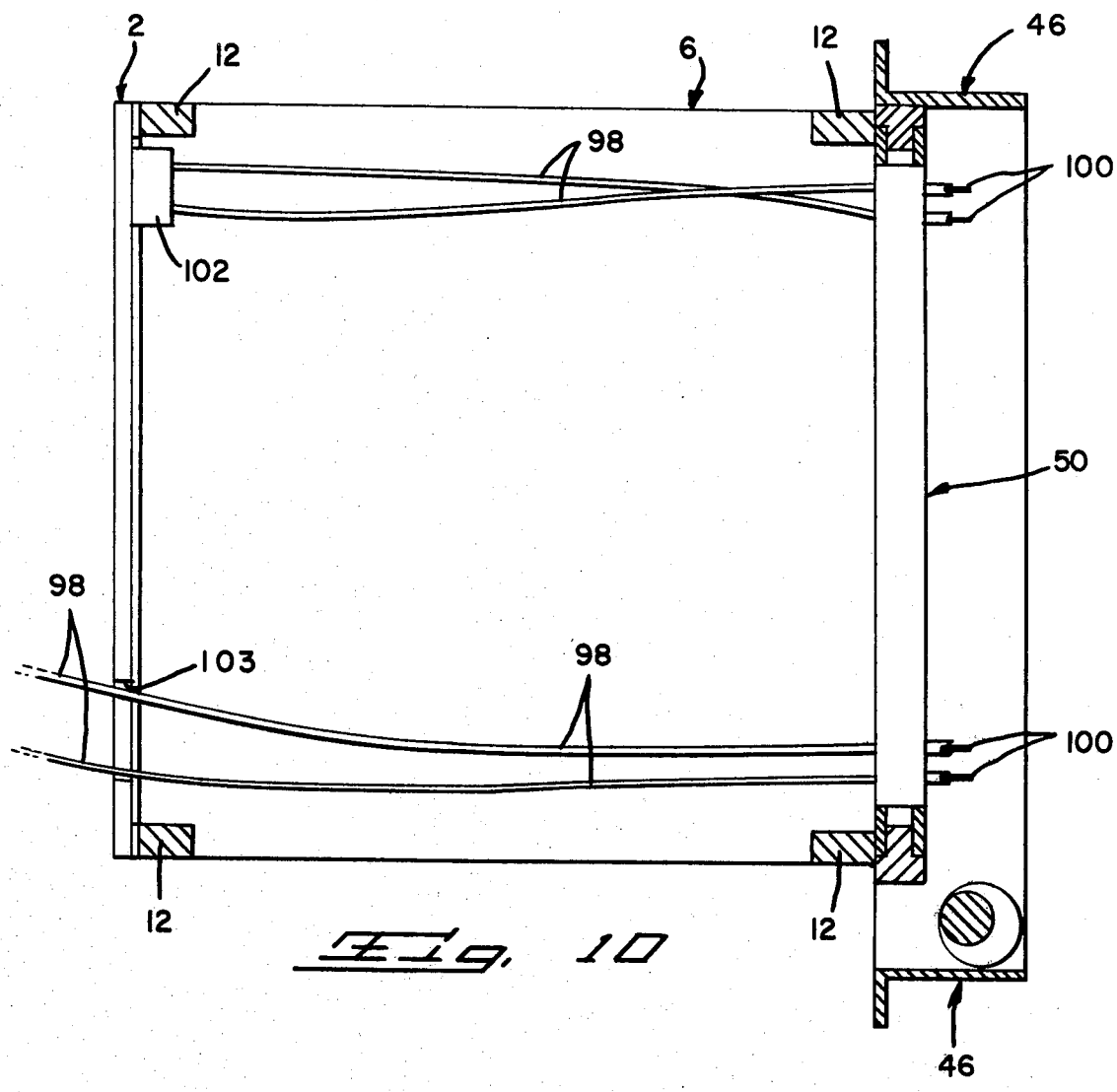

FIG. 10 is an enlarged vertical section of the preferred embodiment shown in FIG. 2 illustrating discrete electrical leads connected to yet another individual section of the rear board in the absence of a circuit card in the card cage, the leads being contained in the card cage and extending therethrough for pluggable connection to either the IO circuit board or directly to the internal workings of the machine to be programmed.

Figure 11:
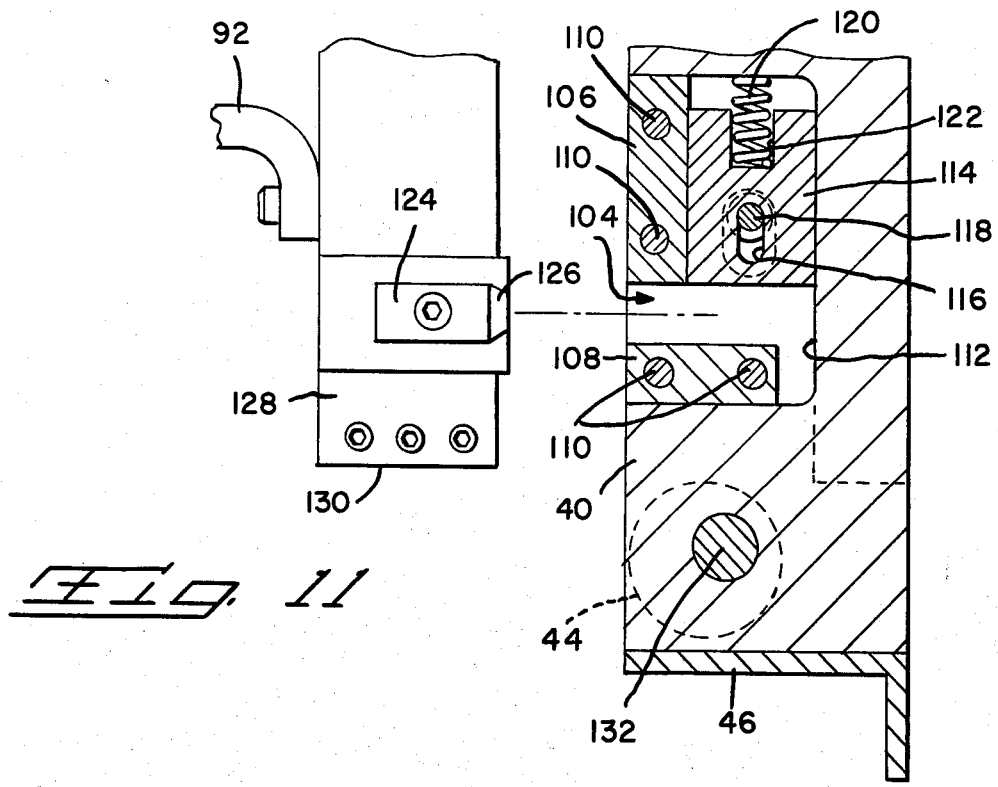
Figure 12:
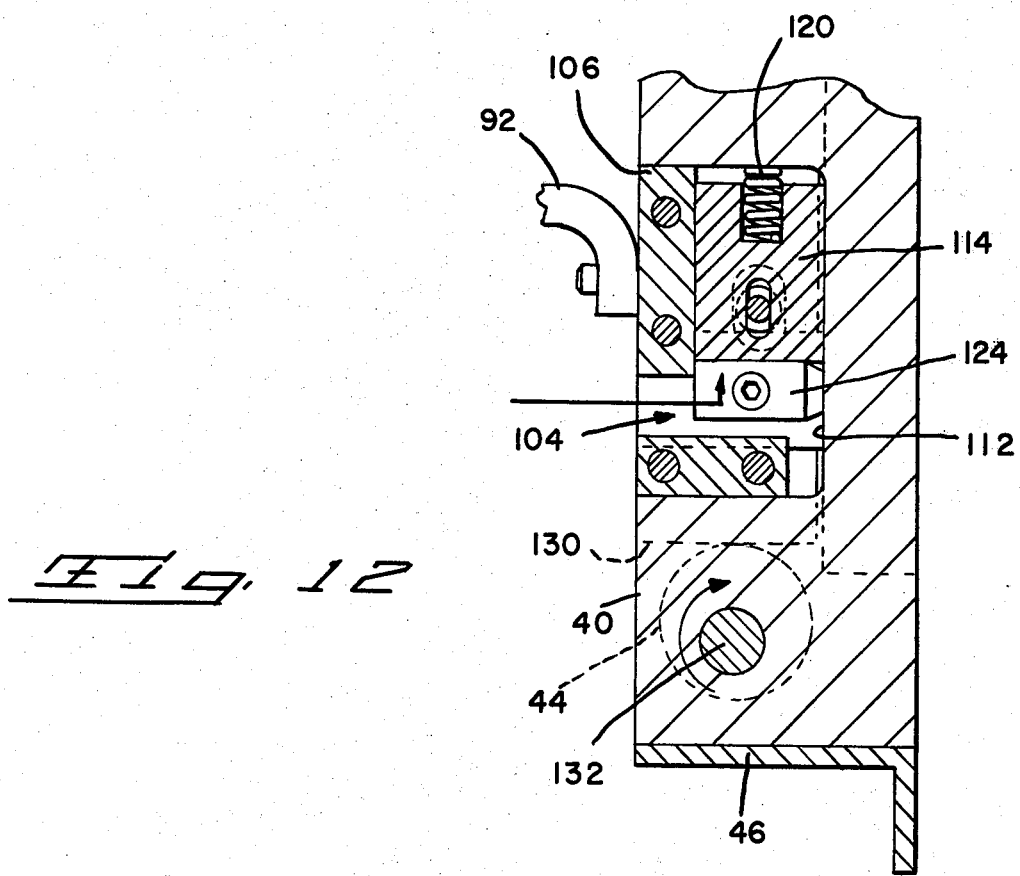

FIGS. 11 and 12 are enlarged fragmentary sections showing alignment and assembly of the bays.

DETAILED DESCRIPTION

With more particular reference to the drawings there is illustrated in FIG. 1 generally at 1 a preferred embodiment of a modular plug board system according to the present invention. The system includes from left to right an IO circuit board 2 generally of rectangular configuration and provided thereon with a plurality of vertically elongate electrical connectors some of which are shown at 4. The IO circuit board carries all of the input and output electrical connections to the internal workings of the machine to be programmed. Such connections are all brought to the IO circuit board and are electrically connected to the electrical connectors 4. The connectors may be any one of a number of types and configurations as will be explained hereinafter. Once the size of the board 2 is determined, or is otherwise known, a suitable card cage, illustrated generally at 6 can be fabricated to suitable dimensions. The card cage includes metal plate vertical end walls 8 and 10 which are generally of rectangular configuration. The end plates are interconnected at their four corners by elongated lightweight girders some of which are shown at 12. Secured to the topmost girders 12 are a plurality of inverted U-shaped channel tracks 14. In similar fashion a bottom pair of girders 12 are provided with parallel spaced U-shaped channel tracks 16 in alignment with the tracks 14 to provide upper and lower pairs of cooperating tracks. The tracks slidably receive upper and lower edges 18 and 20 of corresponding circuit cards, some of which are shown at 22. Each card 22 is fabricated with metal circuit paths, i.e., circuits, on either one or both surfaces thereof. Each card has mounted thereon active circuit devices in the form of LSI chips 24 or other electrical circuit components some of which are shown at 26. The circuit devices are electrically associated with the plated circuits on the cards 22. The circuits are brought out to rearward edges 28 of the cards 22 where they terminate in metal tabs 30. Alternatively the tabs may be electrically connected within an electrical connector which is shown at 32 mounted at the edge 28 of a selected card 22. In similar fashion the circuit paths extend out to a forward edge 34 of each card 22. A row of individual electrical contacts 36 are provided in spaced relationship along the forward edge 34. The circuits of each card 22 are then electrically connected with selected corresponding electrical receptacle contacts 36. The contacts 36 are shown more in detail in FIGS. 3 and also in FIGS. 5, 6, 7, and 9. A more detailed explanation of these Figures will follow.

With reference yet to FIG. 1, to the right of the cards 22 is shown a plug board system, rear bay, generally indicated at 38. The rear bay is fabricated with an outer frame 40 of box-like configuration with a central reinforcing and dividing bar 42. A round cross bar 44 extends from one side of the frame 40 to the other, and is located within an outside wall 46 of the box-like frame 40. Contained within the frame 40 is a relatively thick rear board 48 which appears to form a solid bottom for the frame 40. The rear board is provided with a plurality of apertures arranged in vertical rows. The specific details of the board and apertures are described in U.S. Pat. No. 3,781,763.

Figure 5:
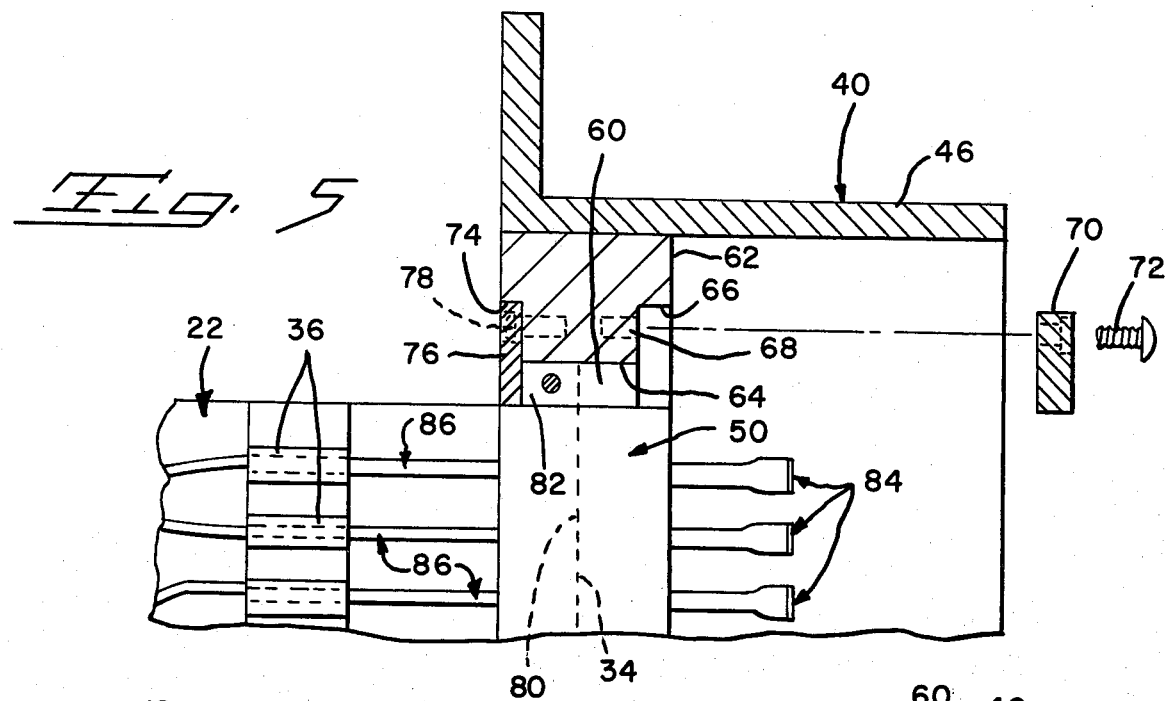
FIG. 5 is an enlarged fragmentary elevation with parts in section and with parts in exploded configuration and illustrating the rear board section as shown in FIG. 3 mounted in the rear bay shown in FIG. 1.
Figure 6:
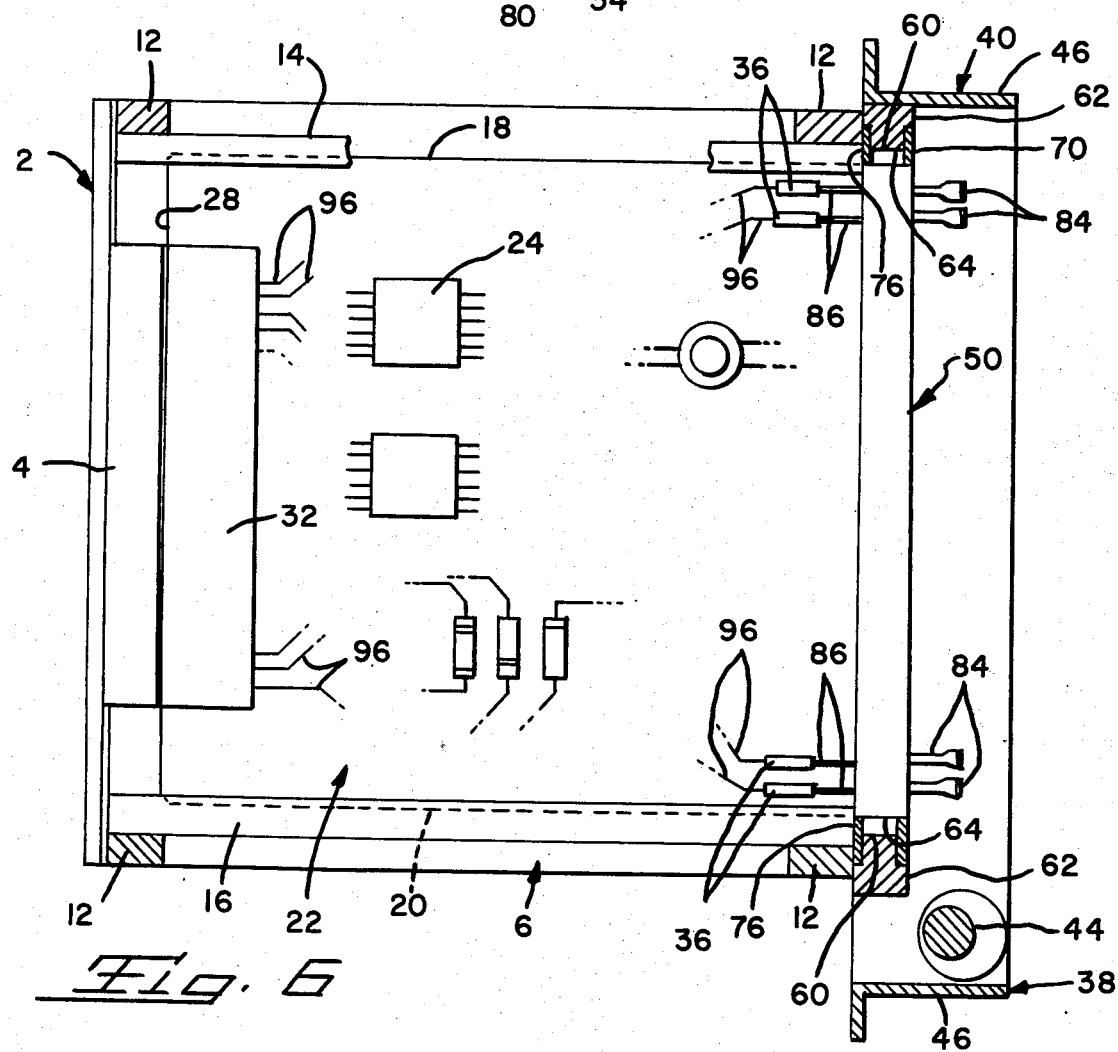
FIG. 6 is an enlarged elevation in section of the preferred embodiment shown in FIG. 2 illustrating in detail the pluggable connections of a circuit card to the IO circuit board and to a section of the rear board which is shown also in FIGS. 3 and 5.

With more particular reference to FIGS. 1, 2, and 3, the rear board 48 according to the present invention will be described more in detail. The rear board 48 is divided in a plurality of vertical sections 50 as distinguished from the one piece board described in U.S. Pat. No. 3,781,763. An exemplary one of such sections 50 is illustrated in FIG. 3. Each rear board section 50 includes a double column of apertures 52 communicating with a front surface 54 and a back surface 56. Each section 50 is provided with vertical side surfaces 58. The sections 50 are stacked together in side to side relationship with the side surfaces 58 abutting. The stacked together sections 50 are mounted in the rear bay frame 40 to form the rear board 48. Accordingly, the rear board 48 is a composite of all the vertically elongate sections 50, stacked together and mounted within the frame 40. The assembly details of the sections 50 in the frame 40 are shown in FIGS. 3, 5, and 6 in conjunction with FIG. 2. Accordingly, as shown in the Figures the upper and lower ends of each section 50 are provided with individual reduced rectangular projecting protuberances or bosses 60. Each section 50 is placed individually within the frame 40. More particularly, FIGS. 5 and 6 illustrate that the frame 40 is provided with upper and lower horizontal elongated mounting blocks 62. The upper mounting block is mounted against the upper sidewall 46. The lower mounting block 62 is mounted in the frame 40 slightly above the cross bar 46 and slightly rearwardly thereof in parallel alignment with the upper mounting block 62. Both the upper and lower mounting blocks 62 are provided with a series of horizontally spaced, relatively deep grooves 64 which freely receive therein corresponding bosses 60. The front face of each mounting block 62 is provided with a horizontal elongated recess 66 intercepting the grooves 64. Between each of the grooves 64 is provided a threaded recess 68. As shown in FIGS. 5 and 6 a metal plate 70 is placed to overlie the bosses 60. The plate is secured by fasteners 72 within the recesses 66. In similar fashion, a rearward surface of each mounting block 62 is provided with a horizontal recess 74 receiving an elongated horizontal mounting plate 76 therein which is secured by fasteners 78 to the mounting block 62. The plate 76 and 70 overlie the bosses 60 to retain the sections 50 in the frame 40.

As shown more particularly in FIGS. 2 and 6, the rear bay 38 is mounted directly to the front of the card cage 6. Any suitable fastening technique may be utilized.

As more particularly shown in FIGS. 3, 5, and 4, each of the sections 50 is provided with a relatively deep vertical slot 80 which communicates with the rear surface 56 and extends through the upper and lower bosses 60. The forward or front edge 34 of each card 22 is provided with upper and lower ears 82. The front edge 34 of the card together with the ears 82 thereof are freely received in corresponding slots 80. Thus, when the plates 76 are mounted to the blocks 62, the plates overlie the ears 82 whereby the cards 22 are physically retained in the grooves 80 of the sections 50.

The circuits on the cards 22 also are electrically connected to the sections 50. More particularly, one vertical row of the apertures 52 in each section 50 is provided with a plurality of electrical contacts some of which are shown at 84. The contacts are pluggably received in the row of apertures 52 and include pin portions or post portions 86 which protrude outwardly rearward of the sections 50. The pins are pluggably connected electrically by virtue of their receipt in corresponding electrical contact receptacles 36 which are mounted to the cards 22 and electrically joined to the circuits of the cards. The details of the electrical contacts 84 are more specifically described in U.S. Pat. No. 3,781,763, and are more particularly illustrated in FIGS. 11 and 12 of that patent. The circuits of the cards 22 are thereby electrically joined to the contacts 84.

FIGS. 1 and 2 illustrate a front bay 86 of a plug board system according to the present invention. The front bay includes an outer frame 88 having a central divider strip 90 and a pair of forwardly projecting handles 92. An apertured front board 94 is contained within the frame. The details of the front board 94 are more particularly described in U.S. Pat. No. 3,341,801. In the present invention the apertured front board is adapted with a pattern of patchcords 95 also described in detail in U.S. Pat. No. 3,341,801. The pattern of patchcords provides a program of interconnections to the contacts 84 of the rear bay 38, when the front bay 88 is mounted to the rear bay 38, for example, by hooking the front bay onto the cross bar 44 and pivoting a lever 96 first to urge the front bay into the rear bay and then to latch the bays together.

FIG. 6 illustrates in detail one form of card 22 within the card cage 6. More particularly, the electrical connector 32 at the rearward edge 28 of the card, has electrical contacts therein (not shown) which are plugged into the electrical connector 4 mounted to the IO circuit board 2. The connectors 4 and 32 are commonly referred to in the art as mother and daughter board connectors of which there are many types such as exemplified in U.S. Pat. Nos. 3,576,515; 3,634,816; and 3,651,444.

Figure 7:
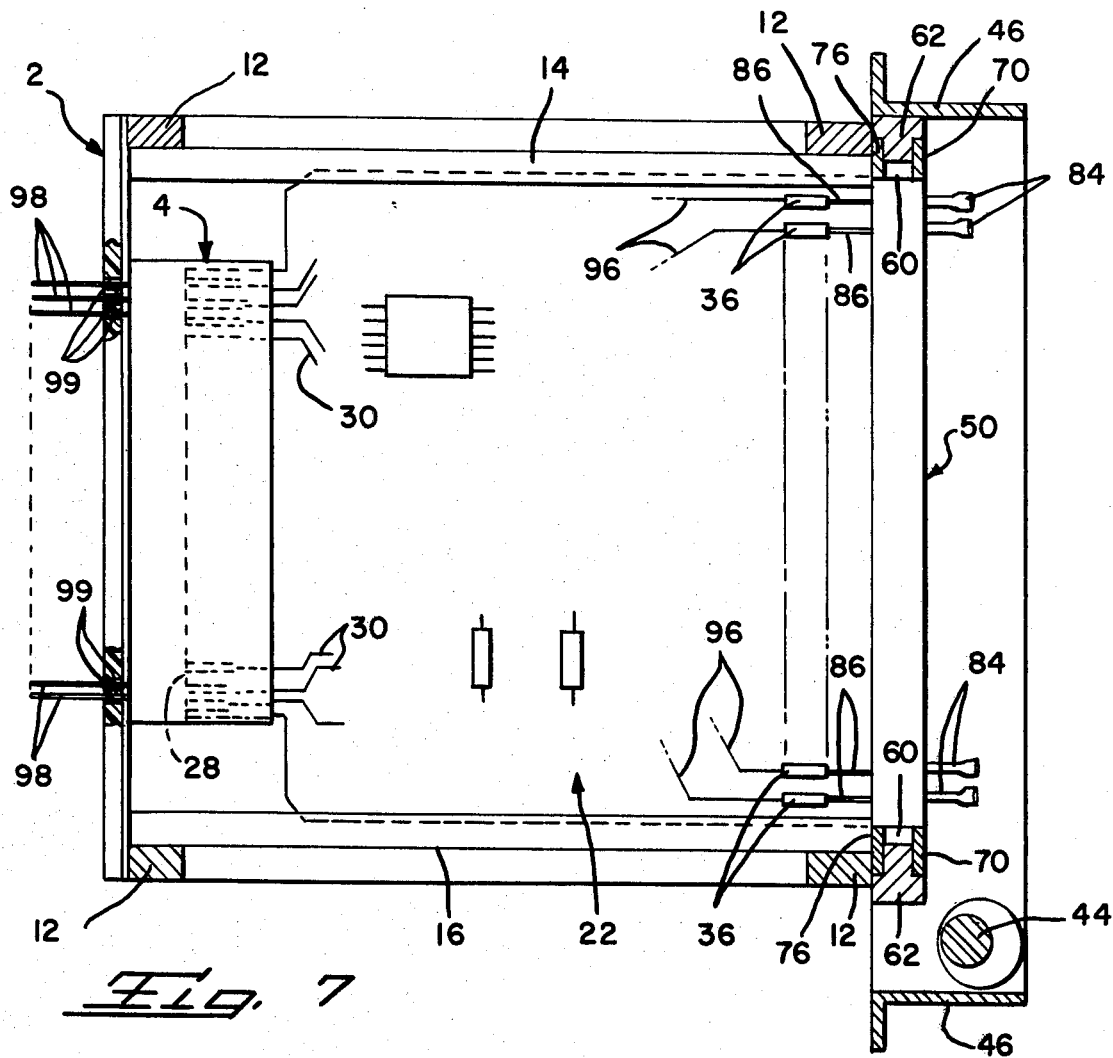
FIG. 7 is an enlarged elevation in section of the preferred embodiment shown in FIG. 2 illustrating another circuit card and the associated connection devices which electrically connect the circuit card to the IO circuit board and to another section of the rear board.
Figure 8:
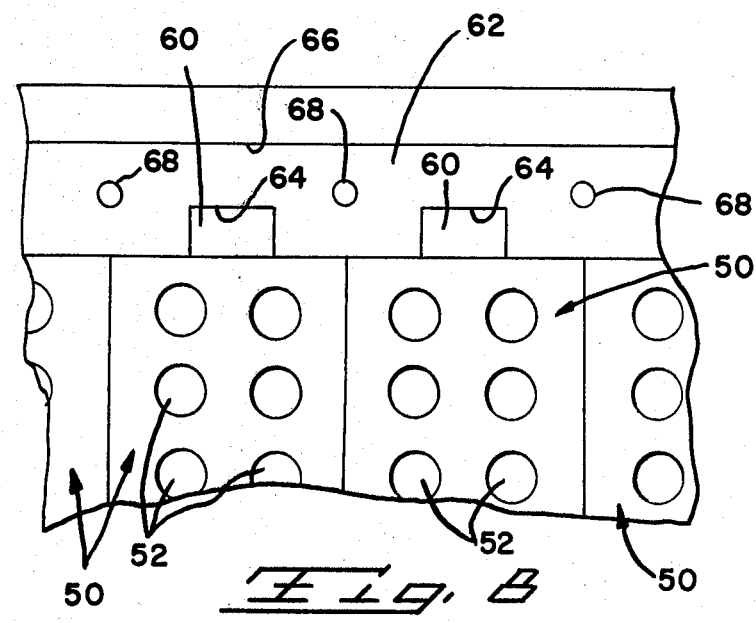
FIG. 8 is an enlarged fragmentary elevation of a portion of the rear bay.

FIG. 7 illustrates another form of card 22 wherein circuit paths 96 are brought to pads 30 at a rearward edge 28 of a card 22. The edge 28 is plugged into an electrical connector 4 of the type which has electrical contacts therein, i.e., edge contacts, which engage the circuit paths 96. The edge contacts include projecting pin or post portions 98 which are soldered into apertures 99 of the IO board 2. A particular form of such a connector 4 is more particularly described in U.S. Pat. No. 3,905,665. The card edge 28 is freely plugged into the connector 4 with the pads 30 engaging corresponding edge contacts.

Figure 9:
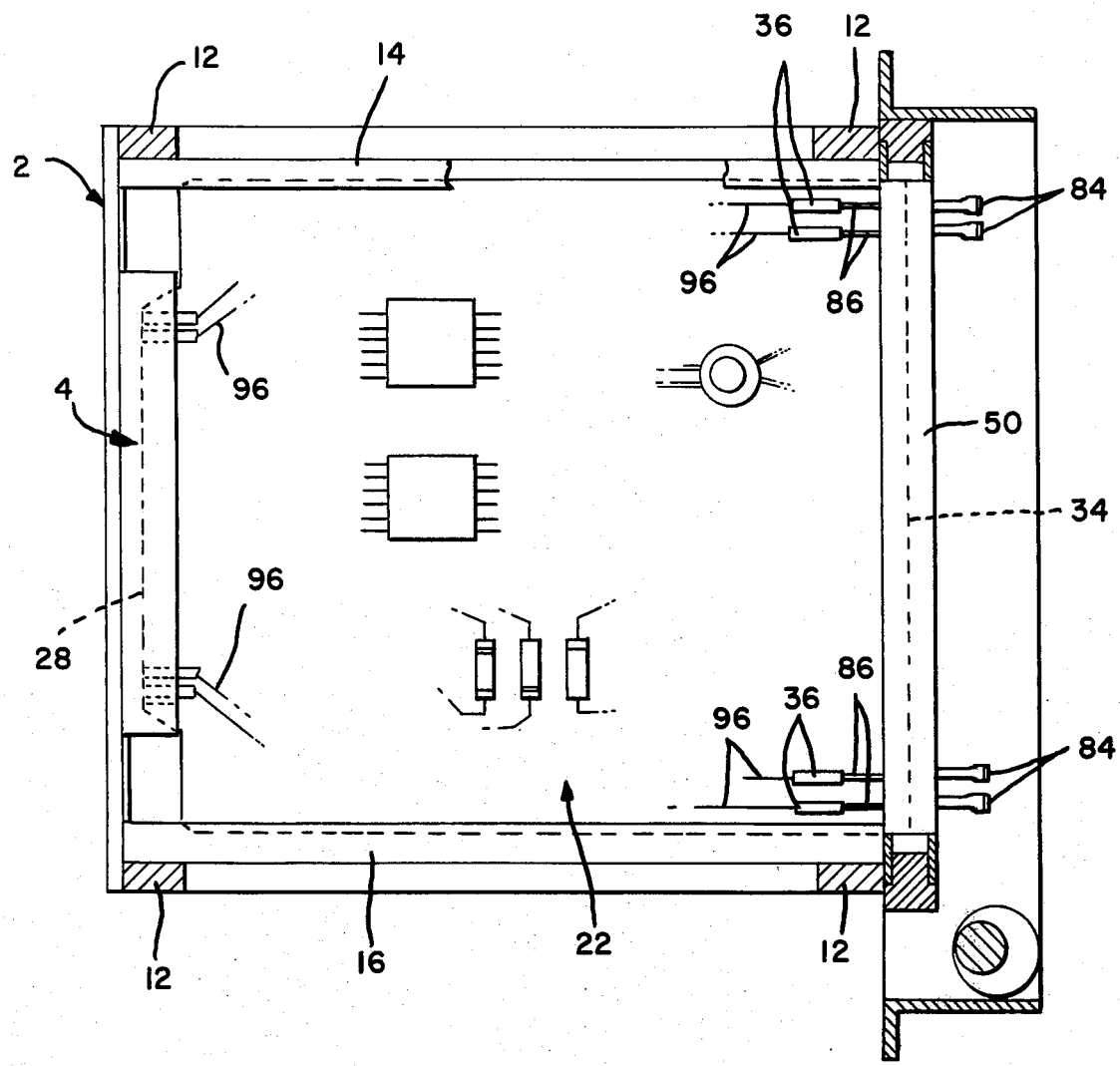
FIG. 9 is an enlarged elevation in section of a portion of the preferred embodiment illustrated in FIG. 2 showing yet another circuit card and its associated electrical connection devices for interconnecting the card with the IO circuit board and with yet another section of the rear board.

FIG. 9 illustrates another type of card 22 wherein circuits 96 are connected to receptacle contacts 36 on a front edge 34 of the card and also extend to the rearward edge 28 of the card which is inserted into a different type of electrical connector 4 mounted on the IO circuit board 2. The connector 4 in this embodiment of FIG. 9 is commonly referred to as an edge connector of the type described in detail in U.S. Pat. Nos. 3,651,432 and 3,665,370. Such connectors are mounted on a printed circuit board and connect circuit paths on the board with electrical contacts in the connector. Such contacts are adapted to electrically engage plated paths on cards, such as the paths 96 on the edge 28 of the card 22 when the card is inserted into the edge connector.

FIGS. 4 and 10 illustrate another preferred embodiment according to the present invention wherein a selected one of the sections 50 does not have a card 22 inserted therein but instead is provided with a plurality of discrete electrical wires or leads, some of which are illustrated at 98, which may be power, signal or coaxial leads. The leads are plugged into plating lined apertures 52 of a selected rear board section 50 at the rear surface 56 thereof. Electrical contacts 100 are plugged into the plating lined apertures 52 from the front surface 54 to make electrical contact with the corresponding leads 98 within the lined apertures 52. The contacts 100 are of the type described in detail in FIG. 6 of U.S. Pat. No. 3,341,801. As shown in FIG. 10, some of the leads 98 may be plugged into a connector 102 mounted on the IO board 2. Certain other leads 98 may extend through a hole 103 in the IO board 2 for connections internally of a machine to be programmed. The leads 98 are fully contained within the card cage 6 and are thereby protected from tangling or from external damage and interferences.

According to the present invention the card 22 may take many forms and may be connected to the IO board 2 in any number of desired ways. The rear board 48 is advantageously assembled one section 50 at a time together with the corresponding card 22. In this manner as each card 22 is assembled, it is capable of being fully tested without requiring assembly of all the sections 50 or the remainder of the cards 22. When all of the sections 50 are assembled, the plating lined apertures provide test points for the cards. In addition, each individual card 22, or individual section 50 containing leads 98, may be separated from the rear board 48 and from the card cage and from the IO circuit board 2 without disturbing the remainder of the assembly. More specifically, as shown in FIG. 5, both the upper and lower plates 70 are removed from the assembly allowing selected removal of any one of the sections 50. As a section 50 is removed none of the other sections 50 need be disturbed. Removal of one of the sections 50 exposes a corresponding card 22 or a plurality of leads 98, whichever has been connected to the removed section 50. More particularly, to expose a card 22, a corresponding section 50 is removed causing withdrawal of post or pin portions 86 of the contacts 84 from corresponding electrical contact receptacles 36 of the board 22. The exposed card may be removed through the space vacated in the rear board 48 by removal of the corresponding section 50. Removal of the card therefore will cause disengagement thereof from the electrical connections to the IO circuit board 2. Such individual removal of a circuit card allows for repair or replacement of the same without disturbing the rest of the assembly.

As shown in FIGS. 1, 11 and 12, the rear bay 38 is provided on each of the inward sides of the frame 40 with upper and lower, horizontal alignment passageways 104 each defined between a pair of identical bearing blocks 106 secured to the sides of the frame 40 by fasteners 110. Each pair of blocks are mounted in a generally rectangular recess 112 machined in corresponding sides of the frame 40. The upper block 110 is elongate vertical. A slide block 114 is mounted between the upper block and a side of the recess 112. The slide block 114 is vertically slidable by virtue of a vertical slot 116 receiving a mounting pin 118 secured to the frame 40. A coil spring 120, received in a top recess 122 of the block 114, engages the inverted wall of the recess 112 and thereby resiliently biases the slide block 114 vertically downward to its lowermost position shown in FIG. 11.

The inner sides of the frame 88 of the front bay 86 includes upper and lower, elongate horizontal keys 124 provided with chamfers 126 on three sides of the end which projects horizontally toward the rear bay 38. Each lower key 124 is provided with a bearing plate 128 mounted to the side of the frame 88. Each plate 128 includes an inverted shoulder 130 which faces the cross bar 44 when the front bay is assembled on the rear bay. More particularly, each key 124 is slidably inserted horizontally of the alignment passageways 104 until stopped against the wall of the recess 112 as shown in FIG. 12. The cross bar 44 is rotated by manually pivoting the handle 96. The cross bar 44 is eccentric with respect to its pivot pins or axles 132, so that when rotated about the axles 132, the cross bar 44 will be displaced also vertically upward, engaging the shoulders 130 of the plates 128, thereby camming the front bay 38 vertically upward a slight amount as shown by the arrow in FIG. 12. Each key 124 will be displaced upwardly and slidably along the space between an upper block 106 and a side wall of a recess 112. Each key will be in locked registration in the space behind an upper block 106. Each slide block 114 will be displaced upwardly by a key in opposition to the resilient action of a corresponding spring 120. The blocks 114 provide a spring loaded vertical hold-down upon the front bay 138.

The cammed upward displacement of the front bay insures wiping engagement of the front bay contacts with the rear bay contacts as more particularly described, for example, in the above referenced U.S. Pat. No. 3,341,801.

It is important for the front bay to be initially aligned precisely with the rear bay to prevent the front bay contacts from striking or otherwise damaging the rear bay contacts. Any premature vertical motion of the front bay when manually aligning the same with the rear bay is undesired. Thus an operator when gripping the handles 92 must ordinarily exercise care when lifting the front bay and adjusting its alignment with the rear bay. The front bay is difficult to control in this manner and damage to the contacts can readily occur. The more closely spaced become the contacts of the rear bay, the less tolerance allowed for premature vertical movement of the rear bay. The upper and lower bearing blocks 106 are used to assist in operation alignment of the rear bay. The blocks 106 provide for precise alignment of the passageways 104. The blocks may be shimmed to precise orientations prior to securing them in place. Wear of the blocks 104, caused by repeated insertion of the keys 124 along the passageways 104 defined by the blocks 104, may necessitate readjustment or replacement thereof. This is readily accomplished without having to replace the keys despite some changes in dimensions thereof due to wear. The lower bearing blocks 106 are elongate horizontally to provide a lengthy shelf support for the keys 124 which must slidably support the entire weight of the front bay 138 during assembly thereof as shown in FIGS. 11 and 12. The chamfered ends of the keys assist in initial entry thereof into the passageways 108.

What has been described and shown in detail are preferred embodiments of the present invention. Other embodiments and modifications thereof which would become apparent to one having ordinary skill in the art is intended to be covered by the spirit and scope of the appended claims.

What is claimed is:

1. A programmable interconnection system, comprising:

a cage, a circuit board mounted removably to one end of said cage, another end of said cage provided with a rear bay divided into a plurality of sections mounted removably to a frame portion of said cage, a plurality of circuit cards on which are mounted active circuit devices interconnected by conductive circuits provided on said cards, said cards extending between said circuit board and said rear bay within the confines of said cage, first electrically conductive means for electrically and removably connecting said circuits of each said cards with a corresponding rear bay section, second electrically conductive means for electrically and removably connecting said circuits of each said cards with said circuit board, a front bay removably mounted on said frame portion directly opposite said rear bay, said front bay provided with jumper interconnecting means therein for electrical connection to said rear bay sections, said front bay and said jumper interconnecting means being removable as a unit from said frame thereby to electrically disconnect said jumper interconnecting means from said rear bay sections, said rear bay sections being in alignment with corresponding circuit cards, and said rear bay sections being individually removable from said frame thereby to expose a corresponding circuit card for removal thereof from said frame and for disconnecting said conductive circuits of the corresponding circuit card from said circuit board.

2. The structure as recited in claim 1, wherein, said rear bay sections are provided with plating lined apertures therein, and further including:

electrical contacts in said plating lined apertures of said rear bay sections electrically engaging said jumper interconnecting means, said plating lined apertures pluggably receiving said first electrically conductive means, and said plating lined apertures being exposed upon removal of said front bay and providing pluggable test apertures for testing individual ones of said circuit cards.

3. The structure as recited in claim 2, and further including:

electrical leads connected to electrical terminals pluggably connected into corresponding plating lined apertures of at least one of said rear bay sections in the absence of a corresponding first electrically conductive means, said leads being contained within the confines of said cage and projecting toward said circuit board and being pluggably connected therein in the absence of a corresponding circuit card.

4. The structure as recited in claim 2, and further including:

electrical leads connected to electrical terminals pluggably connected into corresponding plating lined apertures of at least one of said rear bay sections in the absence of a corresponding first electrically conductive means, said leads being contained within the confines of said cage in the absence of a corresponding circuit card, and said leads projecting through an opening provided in said circuit board.

5. In a plug board system having a frame, a rear bay provided with a board having plating lined apertures and being mounted in said frame, electrical contacts in said apertures, a front bay provided with a board having plating lined apertures and jumper interconnecting means pluggably connected in said selected apertures of said front board, said front board and said jumper interconnecting means being removably mounted in said frame as a unit with said jumper interconnecting means engaging said electrical contacts, the improvement comprising:

at least a pair of bearing blocks mounted on each side of said rear bay defining therebetween a horizontal passageway, a key projecting from each side of said front bay and receivable slidably along said passageway, a vertical recess communicating with each said passageway, a slide block mounted in each said vertical recess and being resiliently spring biased vertically downward, means for camming said front bay vertically upward and for elevating each said key along said recess into engagement with a corresponding said slide block, thereby to raise said jumper interconnecting means vertically into engagement with said electrical contacts, and each said slide block being elevated by a corresponding key against said resilient spring bias.

* * * * *